United States Patent
Kuo et al.

(10) Patent No.: US 7,897,983 B2
(45) Date of Patent: Mar. 1, 2011

(54) LIGHT EMITTING DIODE ASSEMBLY AND LIGHT EMITTING DIODE DISPLAY DEVICE

(75) Inventors: Kun-Sheng Kuo, Miao-Li Hsien (TW); Chuan-Fu Yang, Miao-Li Hsien (TW); Yuan-Fa Chu, Miao-Li Hsien (TW)

(73) Assignee: Foxsemicon Intergrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/613,662

(22) Filed: Nov. 6, 2009

(65) Prior Publication Data
US 2010/0155751 A1 Jun. 24, 2010

Related U.S. Application Data

(62) Division of application No. 12/017,310, filed on Jan. 21, 2008, now Pat. No. 7,728,337.

(30) Foreign Application Priority Data

May 9, 2007 (CN) .......................... 2007 1 0074342

(51) Int. Cl.
*H01L 29/18* (2006.01)

(52) U.S. Cl. ............................................ 257/88; 438/25

(58) Field of Classification Search ..................... 257/88, 257/443
See application file for complete search history.

(56) References Cited

U.S. PATENT DOCUMENTS 7,215,886 B2  5/2007  Maruyama et al.

*Primary Examiner* — Andy Huynh
*Assistant Examiner* — Kimberly M Thomas
(74) *Attorney, Agent, or Firm* — Raymond J. Chew

(57) ABSTRACT

An exemplary light emitting diode (LED) assembly includes a cover, a substrate, a LED unit, a first electrode terminal, and a second electrode terminal. The substrate includes a first surface and a second surface on an opposite side of the substrate thereto. The substrate and the cover cooperatively define a cavity. The LED unit is received in the cavity. The first and the second electrode terminals extend from the second surface. The first electrode terminal is electrically connected to one of a positive lead and a negative lead of the LED unit and the second electrode terminal is electrically connected to the other. The second electrode terminal includes a first electrode portion and a second electrode portion symmetrically arranged at opposite sides of the first electrode terminal. The first and the second electrode portions are at least partially symmetrical with respect to the first electrode terminal.

8 Claims, 10 Drawing Sheets

_US 7,897,983 B2_

LIGHT EMITTING DIODE ASSEMBLY AND LIGHT EMITTING DIODE DISPLAY DEVICE

CROSS-REFERENCE TO RELATED APPLICATION

This patent application is divisional application of application Ser. No. 12/017,310, filed on Jan. 21, 2008, now U.S. Pat. No. 7,728,337, entitled "LIGHT EMITTING DIODE ASSEMBLY AND LIGHT EMITTING DIODE DISPLAY DEVICE", assigned to the same assignee, disclosure of which is incorporated herein by reference in its entirety.

BACKGROUND

1. Technical Field

The present invention relates to light emitting diode assemblies and light emitting diode display devices.

2. Discussion of Related Art

Light emitting diode (LED) assemblies having various sizes and display effects have been developed and are available in the market. Depending on the complexity of the required illumination pattern, most LED display devices include a number of LED assemblies arranged in an array and selectively switchable on/off to generate such an illumination pattern.

Referring to FIG. 10, a typical LED display device is provided. The LED display device includes a number of lead-frame LED assemblies 91, a positioning member 92, and a printed circuit board 93. In FIG. 10, only one LED assembly 91 is shown for the purpose of illustration. The LED assemblies 91 each have a positive electrode 911 and a negative electrode 912. The positioning member 92 defines a number of positioning holes 920 penetrating therethrough. The LED assemblies 91 each is installed in a corresponding positioning hole 920 and the positive electrode 911 and the negative electrode 912 are soldered on and penetrate through the printed circuit board 93.

In assembly of the LED display device, because each of the LED assemblies 91 is a unidirectional conduction device, the positive and the negative electrodes 911, 912 of each of the LED assemblies 91 are necessary to be distinguished beforehand, then the LED assemblies 91 are correctly electrically connected with the printed circuit board 93. However, distinguishing between the positive and the negative electrodes 911, 912 is time consuming.

Therefore, what is needed is a LED assembly, and a LED display device with a simplified and effective assembling process.

SUMMARY

A preferred embodiment provides a light emitting diode (LED) assembly. The LED assembly includes a cover, a substrate, a LED unit, a first electrode terminal, and a second electrode terminal. The substrate includes a first surface and a second surface on an opposite side of the substrate to the first surface. The substrate and the cover cooperatively define a cavity. The LED unit is received in the cavity. The first electrode terminal and the second electrode terminal extend from the second surface of the substrate. The first electrode terminal is electrically connected to one of a positive lead and a negative lead of the light emitting diode unit. The second electrode terminal is electrically connected to the other of the positive lead and the negative lead thereof. The second electrode terminal includes a first electrode portion and a second electrode portion symmetrically arranged at opposite sides of the first electrode terminal. The first electrode portion and the second electrode portion are at least partially symmetrical with respect to the first electrode terminal.

Another preferred embodiment provides a LED display device. The LED display device includes a plurality of LED assemblies as described above, a positioning member, and a circuit board. The positioning member is fixed on the circuit board and the positioning member defines a plurality of positioning holes configured for receiving the LED assemblies. The circuit board includes a plurality of electrode pad units each comprising a first electrode pad and a second electrode pad electrically connected with the respective first electrode terminal and the second electrode terminal.

Detailed features of the present LED assembly and LED display device will become more apparent from the following detailed description and claims, and the accompanying drawings.

BRIEF DESCRIPTION OF THE DRAWINGS

Many aspects of the present LED assembly and LED display device can be better understood with reference to the following drawings. The components in the drawings are not necessarily drawn to scale, the emphasis instead being placed upon clearly illustrating the principles of the present LED assembly and LED display device. Moreover, in the drawings, like reference numerals designate corresponding parts throughout the several views, wherein.

DETAILED DESCRIPTION OF THE PREFERRED EMBODIMENTS

Reference will now be made to the drawings to describe the preferred embodiments of the light emitting diode (LED) assembly and the LED display device, in detail.

Figure 1:
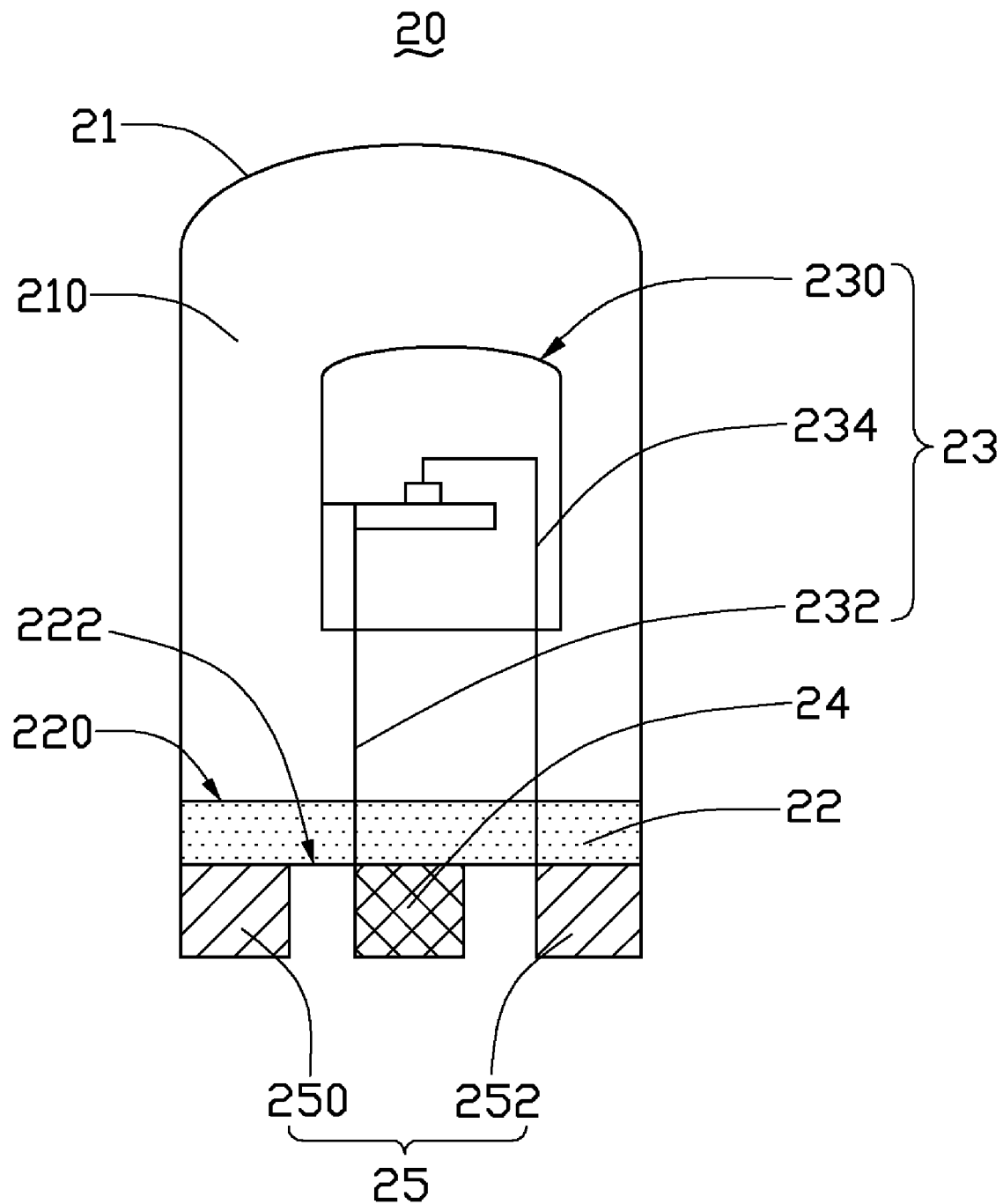
FIG. 1 is a schematic, front view of a LED assembly, according to a first exemplary embodiment.
Figure 2:
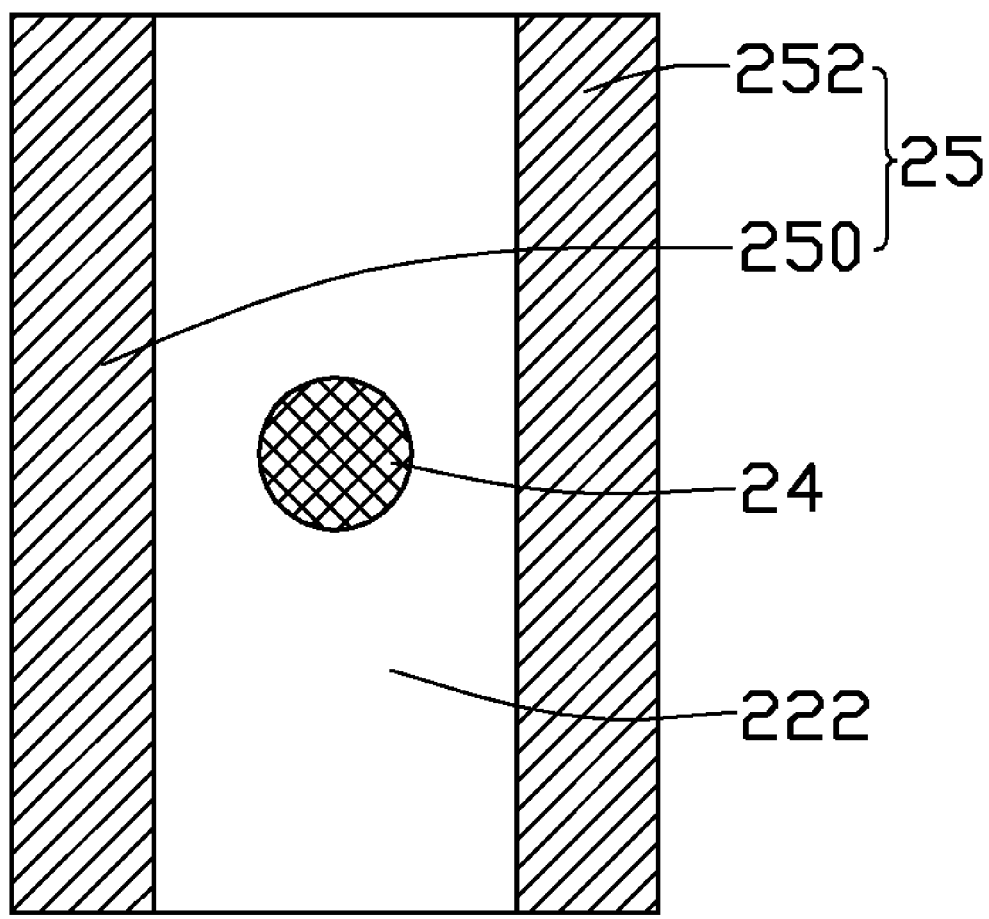
FIG. 2 is a bottom view of the LED assembly shown in FIG. 1.

Referring now particularly to FIGS. 1 and 2, a LED assembly 20, according to a first exemplary embodiment, is provided. The LED assembly 20 includes a cover 21, a substrate 22, a LED unit 23, a first electrode terminal 24 and a second electrode terminal 25.

The cover 21 is suitably made of light transmissive materials such as plastic, resin and glass.

The substrate 22 is a glass fiber board, a flexible printed circuit board or a ceramic board. The substrate 22 includes a first surface 220 and a second surface 222 on an opposite side of the substrate 22 to the first surface 220. The first surface 220 and the cover 21 cooperatively define a cavity 210.

The LED unit 23 may be a LED lamp such as a surface mount device LED lamp, a chip on board LED lamp, and a lead frame LED lamp. In the illustrated embodiment, the LED unit 23 is a lead frame LED lamp received in the cavity 210. The LED unit 23 includes an encapsulation body 230, a first lead 232 and a second lead 234. Alternatively, the LED unit 23 also may be a LED chip electrically connected with the first electrode terminal 24 and the second electrode terminal 25 by wire bonding.

Referring to FIG. 2, the first electrode terminal 24 and the second electrode terminal 25 extend from the second surface 222 of the substrate 22. The first electrode terminal 24 is electrically connected to one of a positive lead and a negative lead of the LED unit 23, and the second electrode terminal 25 is electrically connected to the other of the positive lead and the negative lead thereof. The second electrode terminal 25 includes a first electrode portion 250 and a second electrode portion 252 arranged at both sides of the first electrode terminal 24. The first electrode portion 250 and the second electrode portion 252 have an identical bar-shape. The first electrode portion 250 and the second electrode portion 252 are suitably symmetrical with respect to the first electrode terminal 24.

Figure 3:
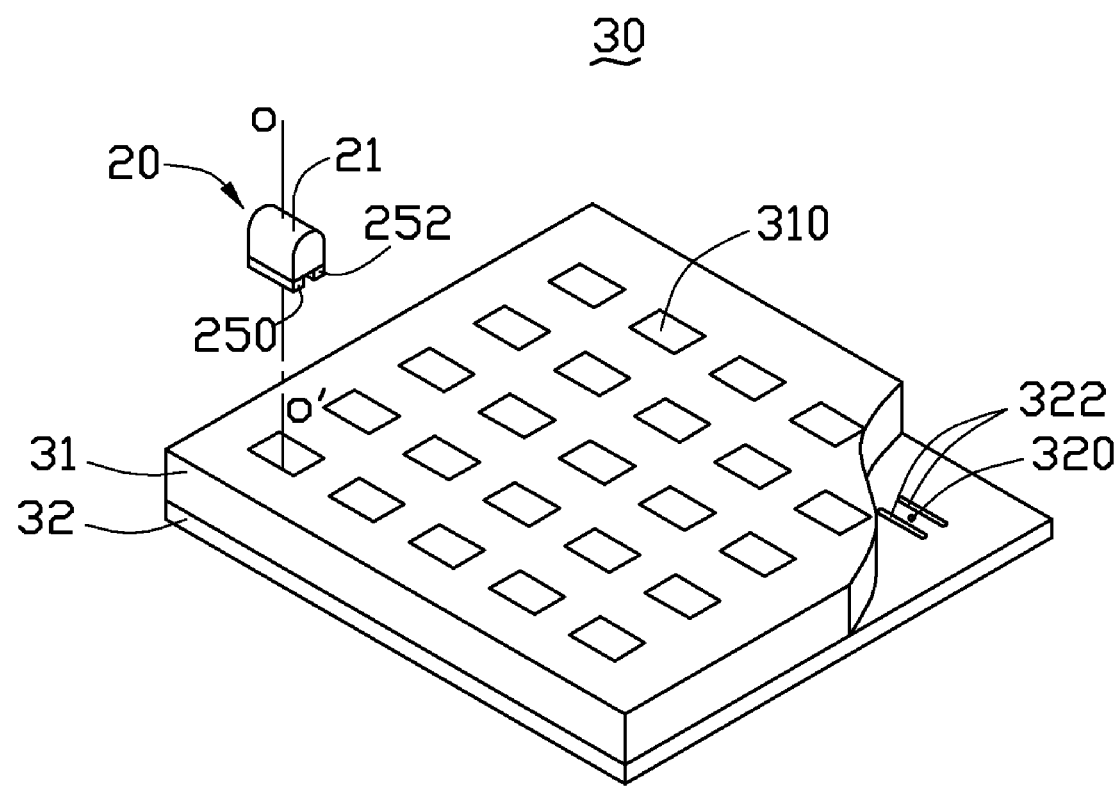
FIG. 3 is a schematic, isometric view of a LED display device, according to an exemplary embodiment, employing the LED assembly as shown in FIG. 1.

Referring to FIG. 3, a LED display device 30 employing a number of LED assemblies 20 is provided. It is noted that only one LED assembly 20 is shown for the purpose for illustration. The LED display device 30 further includes a positioning member 31 and a circuit board 32.

The positioning member 31 defines a number of positioning holes 310 arranged in an array and the positioning holes 310 are configured (i.e., structured and arranged) for receiving the LED assembly 20. The positioning member 31 is fixed on the circuit board 32. The positioning member 31 is made from a material selected from a group consisting of plastics and alloys.

The circuit board 32 includes a plurality of electrode pad units that each comprise a first electrode pad 320 and a second electrode pad 322. The first electrode pad 320 and the second electrode pad 322 are electrically connected to an interior circuitry of the circuit board 32. The first electrode pads 320 and the second electrode pads 322 are respectively electrically connected to a corresponding one of the first electrode terminal 24 and the second electrode terminal 25. As such, when the LED assembly 22 is received in the positioning hole 310, the circuit board 32 supplies electrical power to the first and second electrode terminals 24, 25 by the first and second electrode pads 320 and 322.

Because the first electrode portion 250 and the second electrode portion 252 of the second electrode terminal 25 are symmetrical with respect to the first electrode terminal 24, even when the LED assembly 20 is rotated round OO' by 180 degrees and assembled into the through hole 310, the first and second electrode terminals 24 and 25 can still draw power normally from the first and second electrode pads 320 and 322 with proper polarity.

Figure 4:
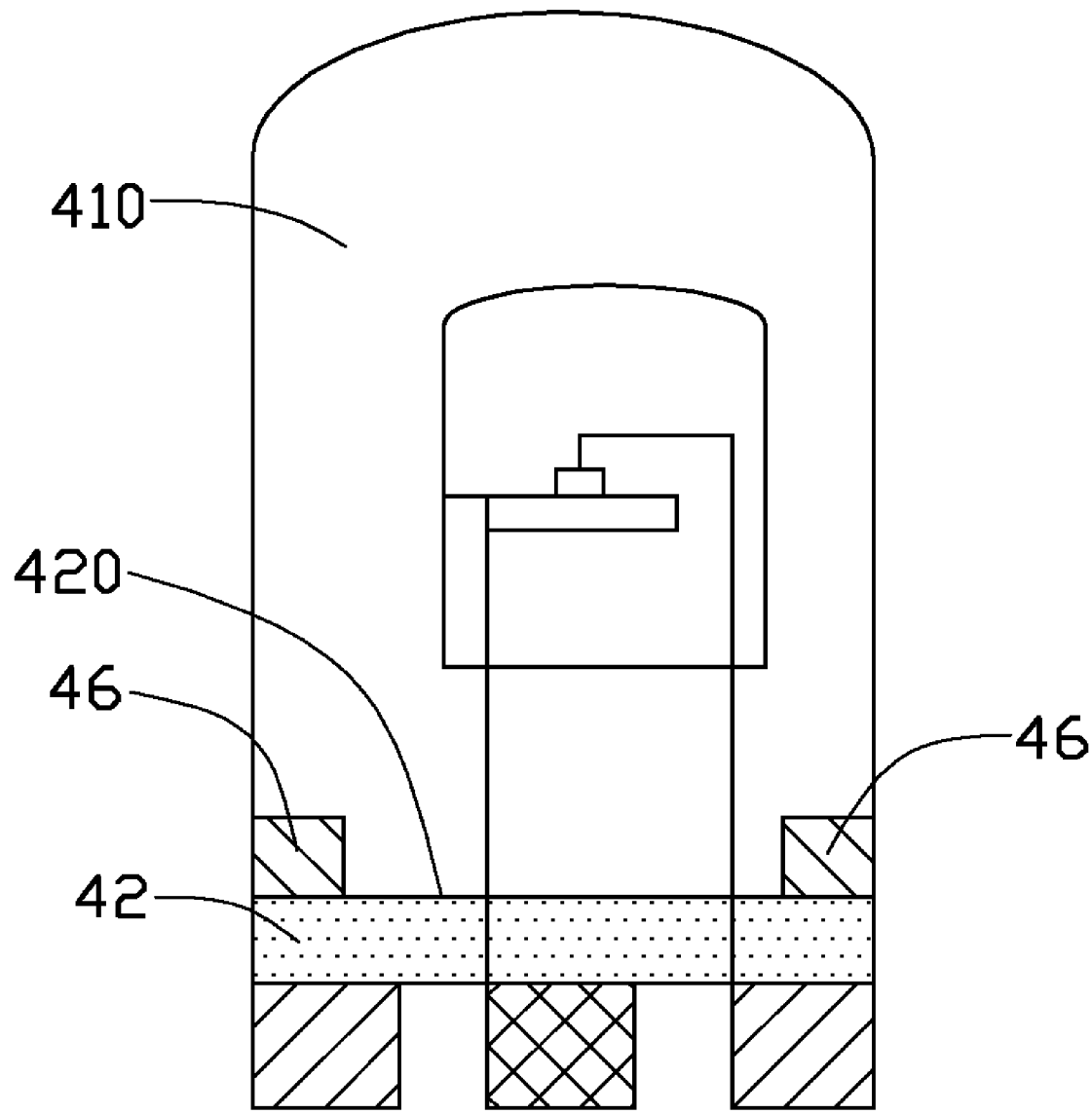
FIG. 4 is a schematic, front view of a LED assembly, according to a second exemplary embodiment.

Referring to FIG. 4, a LED assembly 40, according to a second exemplary embodiment, is provided. The configuration of the LED assembly 40 is generally similar to the above-mentioned LED assembly 20. However, the LED assembly 40 further includes magnetic members 46 arranged on the first surface 420 of the substrate 42 and received in the cavity 410. The magnetic members 46 are made of a material selected from a group consisting of iron, aluminum-nickel-cobalt (Al—Ni—Co), neodymium-iron-boron (Nd—Fe—B) and samarium-cobalt (Sm—Co). When the LED assembly 40 is employed in the LED display device 30, the first electrode pads 320 and the second electrode pads 322 of the LED display device 30 can be magnetic electrodes. When the LED assembly 40 is assembled into the positioning hole 310 of the positioning member 31, the LED assembly 40 would be fixed in the positioning hole 310 by a magnetic force between the magnetic members 46 and the first and second electrode pads 320 and 322, thus making assembly of the LED display device 30 simple and convenient.

Figure 5:
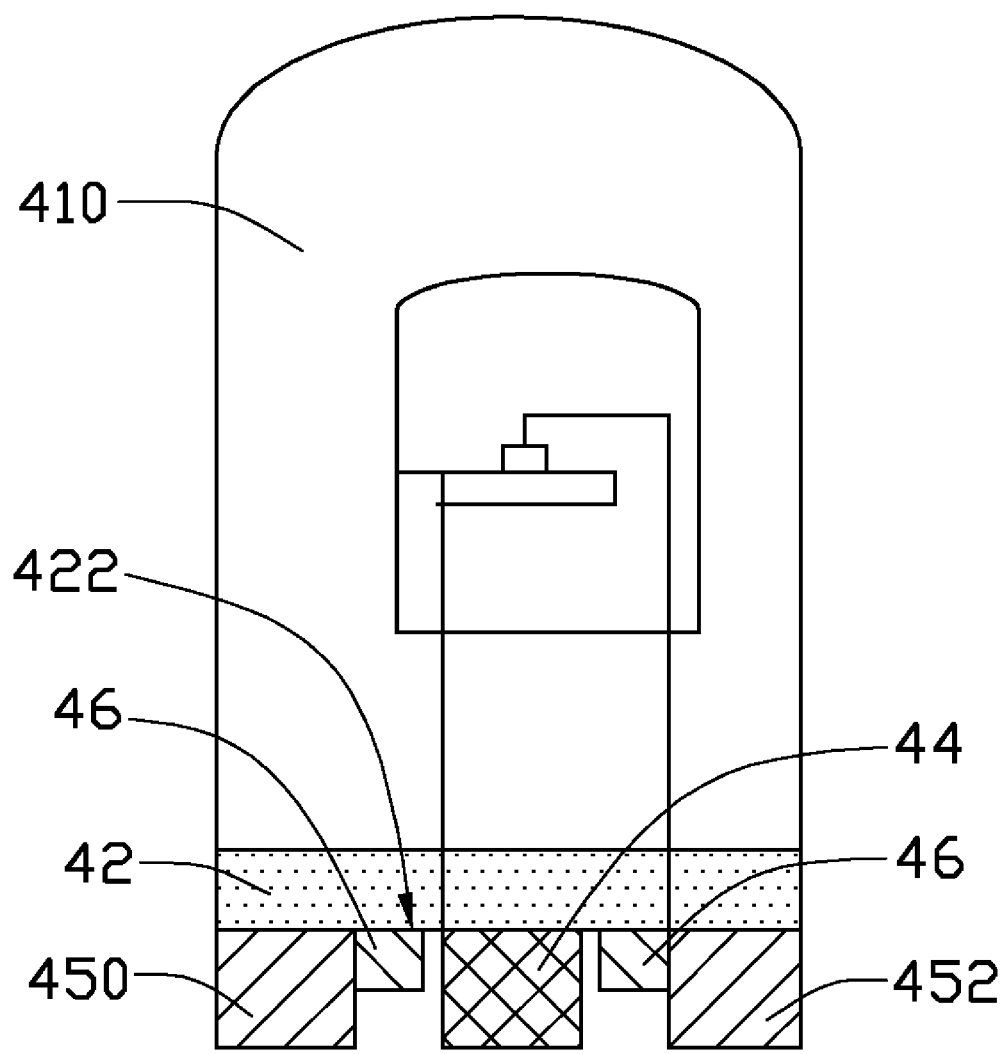
FIG. 5 is a schematic, front view of a LED assembly with an alternative configuration of magnetic members, according to the second exemplary embodiment.

Referring to FIG. 5, alternatively, the magnetic members 46 also can be disposed on the second surface 422 of the substrate 42 and at the outside of the cavity 410. At least one of the first electrode terminal 44 and the second electrode terminal 45 is electrically insulated from the magnetic members 46.

It is noted that, the first electrode portion 250 and the second electrode portion 252 of the second electrode terminal 25 is not limited to being bar-shaped. The first electrode portion 250 and the second electrode portion 252 of the second electrode terminal 25 also may have other shapes, as long as the polarity of the LED assembly is still correct after being rotated round its central axis (shown as OO' in FIG. 3) by a certain angle and assembled into the positioning hole 310.

Figure 6:
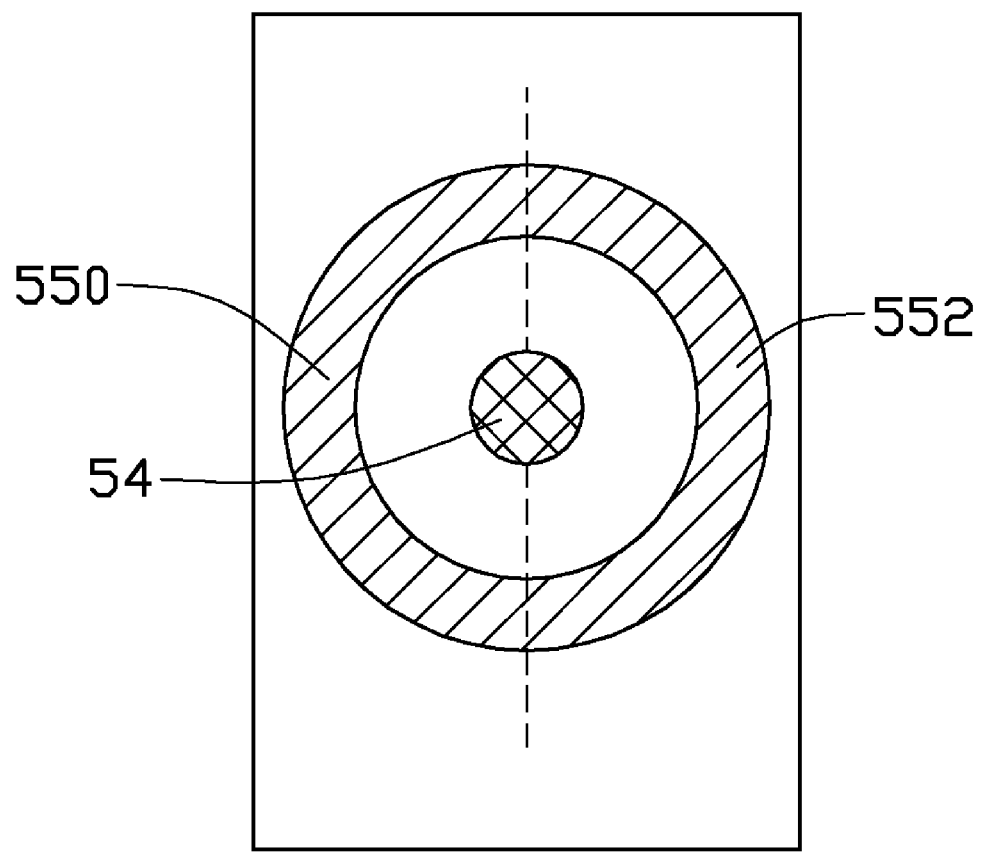
FIG. 6 is a schematic, bottom view of a LED assembly, according to a third exemplary embodiment.

Referring to FIG. 6, a LED assembly 50 according to a third exemplary embodiment of the present invention is provided. The configuration of the LED assembly 50 is generally similar to the above-mentioned LED assembly 10. However, the first electrode portion 550 and the second electrode portion 552 of the second electrode terminal each have a semi-circular ring shape held in contact with each other.

Figure 7:
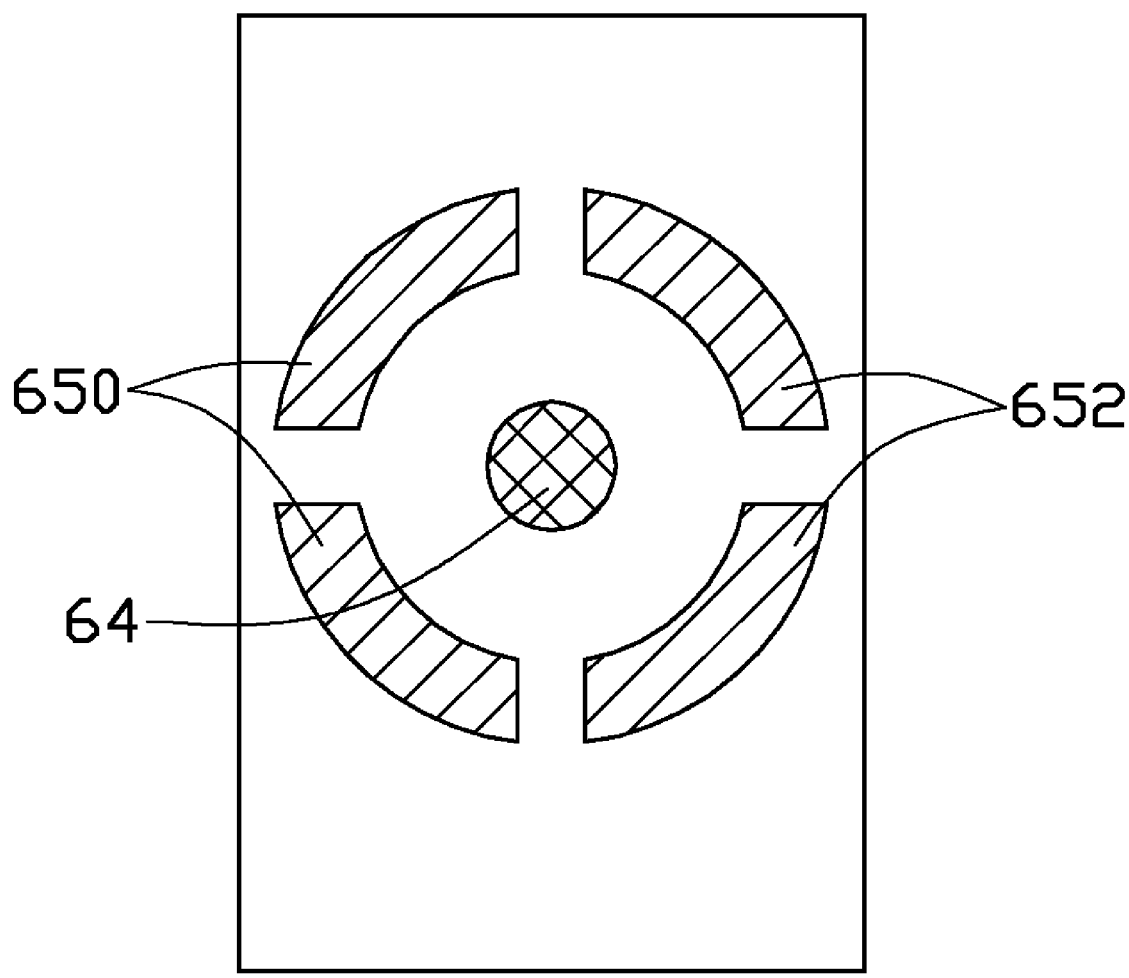
FIG. 7 is a schematic, bottom view of a LED assembly, according to a fourth exemplary embodiment.

Referring to FIG. 7, a LED assembly 60 according to a fourth exemplary embodiment of the present invention is provided. The configuration of the LED assembly 60 is generally similar to the above-mentioned LED assembly 10. However, the first electrode portion 650 and the second electrode portion 652 of the second electrode terminal each has a broken semi-circular ring shape which does not contact the other.

Figure 8:
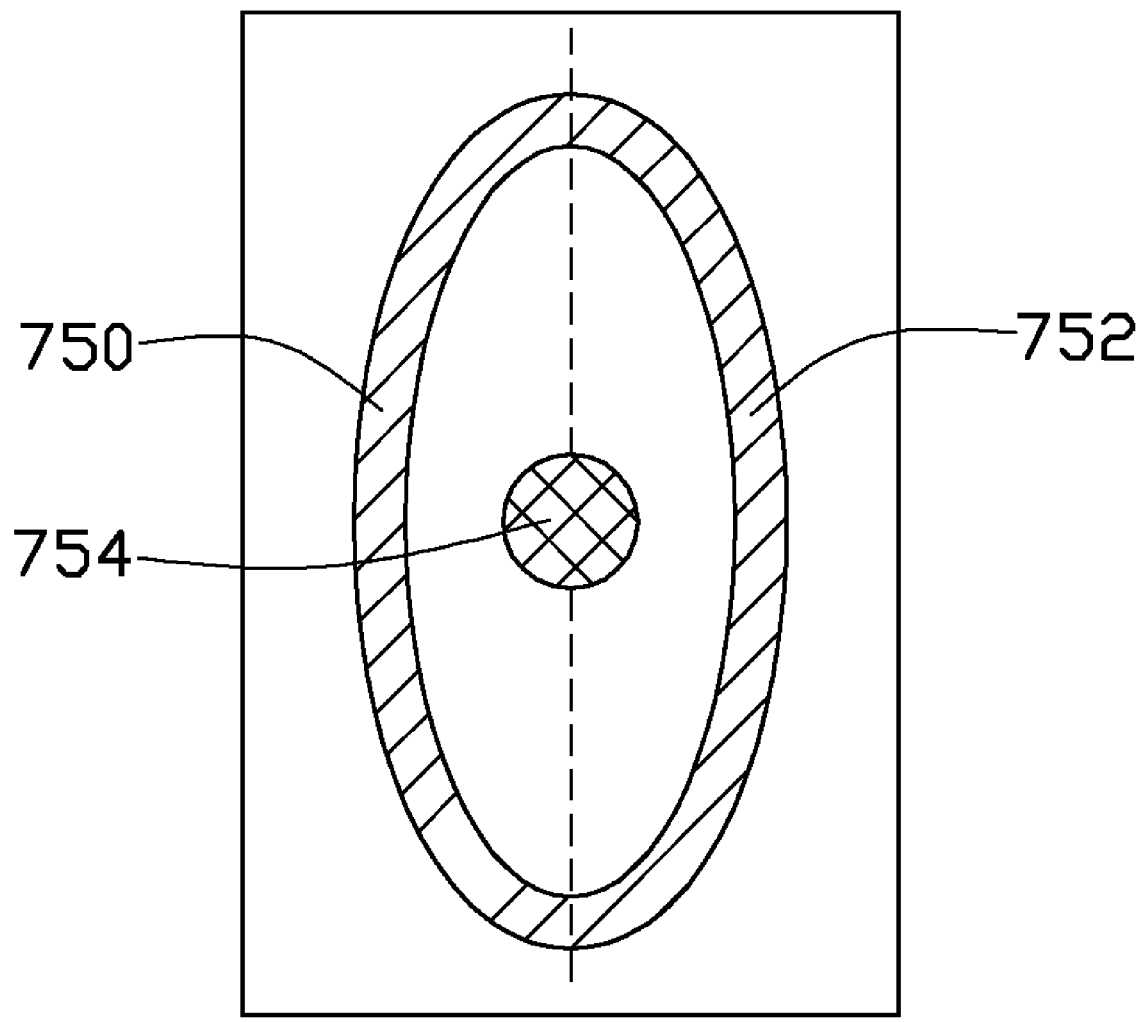
FIG. 8 is a schematic, bottom view of a LED assembly, according to a fifth exemplary embodiment.

Referring to FIG. 8, a LED assembly 70 according to a fifth exemplary embodiment of the present invention is provided. The configuration of the LED assembly 70 is generally similar to the above-mentioned LED 10. However, the first electrode portion 750 and the second electrode portion 752 of the second electrode terminal each have semi-elliptical ring shapes, and contact with each other.

When the first electrode portion and the second electrode portion of the second electrode terminal have bar, semi-circular ring, broken semi-circular ring or semi-elliptic ring shape, the second power supply electrode 322 of the light emitting diode display device 30 suitably has a shape matching with the first electrode portion and the second electrode portion of the second electrode terminal. The first electrode terminal may be round, ellipsoid, rectangular, triangular etc. Accordingly, the first power supply electrode 320 has a shape matching with the first electrode terminal.

Figure 9:
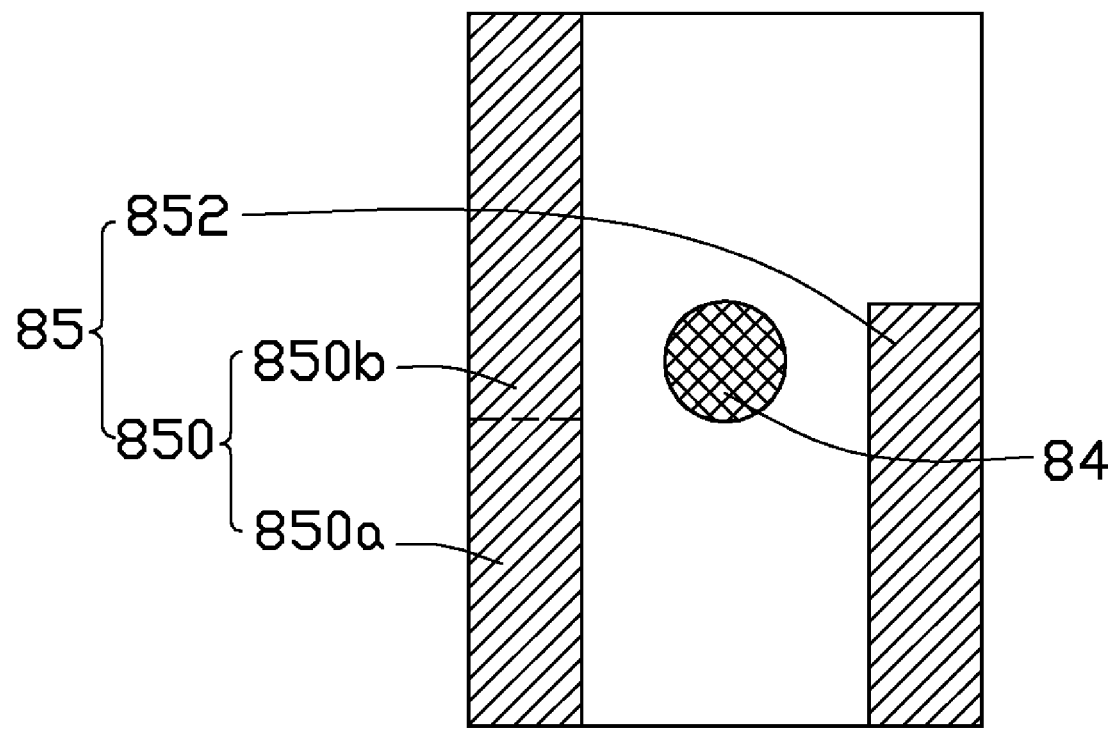
FIG. 9 is a schematic, bottom view of a LED assembly, according to a sixth exemplary embodiment.
Figure 10:
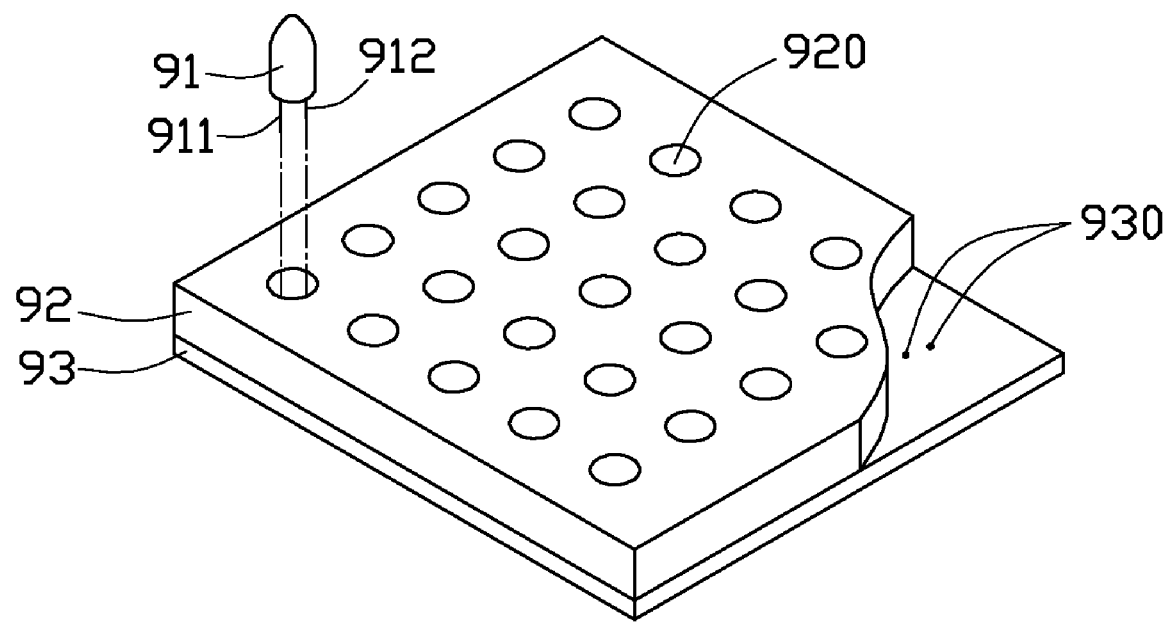
FIG. 10 is a schematic, isometric view of a conventional LED display device employing a number of LED assemblies.

Referring to FIG. 9, a LED assembly 80 according to a sixth exemplary embodiment of the present invention is provided. The difference between the LED assembly 80 and the above-mentioned LED assembly 10 is that, the first electrode portion 850 of the second electrode terminal 85 is bar-shaped, and the first electrode portion 850 includes two parts 850a and 850b. The second electrode portion 852 has identical size and shape to the part 850b. The second electrode portion 852 and the part 850b are symmetrical with respect to the first electrode terminal 84. When employed in the light emitting diode display device 30, even the light emitting diode assembly 80 is rotated round its central axis by a certain angle and assembled into the through hole 310, the first and second electrode terminals 84 and 85 can also normally draw power from the first and second electrode pads 320 and 322 with proper polarity.

The above-mentioned LED assemblies 20, 40, 50, 60, 70, 80 each includes a first electrode terminal and a second electrode terminal. The second electrode terminal includes a first electrode portion and a second electrode portion. The first electrode portion and the second electrode portion are at least partially symmetrical with respect to the first electrode terminal. When being assembled in to the light emitting diode display device, the light emitting diode assembly always receives satisfactory polarity power without requiring identification.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A light emitting diode display device, comprising:
a plurality of light emitting assemblies each comprising:
a cover;
a substrate including a first surface and a second surface on an opposite side of the substrate to the first surface, the substrate and the cover cooperatively defining a cavity;
a light emitting diode unit received in the cavity;
a first electrode terminal and a second electrode terminal extending from the second surface of the substrate, the first electrode terminal being electrically connected to one of a positive lead and a negative lead of the light emitting diode unit, the second electrode terminal being electrically connected to the other of the positive lead and the negative lead thereof; the second electrode terminal including a first electrode portion and a second electrode portion symmetrically arranged at opposite sides of the first electrode terminal; and
a circuit board with the light emitting assemblies mounted thereon, the circuit board comprising a plurality of electrode pad units each comprising a first electrode pad and a second electrode pad electrically connected with the respective first electrode terminal and the second electrode terminal.

2. The light emitting diode display device according to claim 1, further comprising a positioning member fixed on the circuit board, the positioning member defining a plurality of positioning holes arranged in an array, the light emitting diode assemblies being received in the positioning holes.

3. The light emitting diode display device according to claim 1, wherein the positioning member is made of a material selected from a group consisting of plastic and alloy.

4. The light emitting diode display device according to claim 1, wherein the light emitting assemblies each further comprise a magnetic member fixed on at least one of the first surface and the second surface of the substrate.

5. The light emitting diode display device according to claim 4, wherein the magnetic member is made of a material selected form a group consisting of iron, aluminum-nickel-cobalt, neodymium-iron-boron and samarium-cobalt.

6. The light emitting diode display device according to claim 1, wherein a section of the first electrode terminal has a round, ellipsoid, rectangular or triangular shape.

7. The light emitting diode display device according to claim 1, wherein a section of the first electrode portion has a rectangular, semi-circular ring, or semi-elliptical ring shape.

8. The light emitting diode assembly according to claim 1, wherein the first electrode portion and the second electrode portion contact with each other.

\* \* \* \* \*